(12) United States Patent
Kim

(10) Patent No.: US 10,333,501 B2
(45) Date of Patent: Jun. 25, 2019

(54) BUFFER CIRCUIT AND DEVICE INCLUDING THE SAME

(71) Applicant: SK hynix Inc., Gyeonggi-do (KR)

(72) Inventor: Jae-Heung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/847,523

(22) Filed: Dec. 19, 2017

(65) Prior Publication Data

US 2019/0007032 A1 Jan. 3, 2019

Related U.S. Application Data

(60) Provisional application No. 62/526,691, filed on Jun. 29, 2017.

(51) Int. Cl.
*G11C 7/10* (2006.01)
*H03K 3/356* (2006.01)
*G05F 3/26* (2006.01)

(52) U.S. Cl.
CPC ....... *H03K 3/356113* (2013.01); *G05F 3/262* (2013.01); *G11C 7/1084* (2013.01)

(58) Field of Classification Search
CPC .. H03K 3/356113; G05F 3/262; G11C 7/1084
See application file for complete search history.

(56) References Cited

U.S. PATENT DOCUMENTS

| 6,731,169 B2 * | 5/2004 | Tsukagoshi | H03F 3/3028 330/253 |
|---|---|---|---|
| 6,909,414 B2 | 6/2005 | Tsuchi et al. | |
| 2006/0125759 A1 * | 6/2006 | An | G09G 3/3688 345/98 |
| 2011/0050289 A1 * | 3/2011 | Lee | H03K 19/00384 327/108 |
| 2011/0291639 A1 * | 12/2011 | Lee | H03K 19/00384 323/313 |
| 2015/0187423 A1 * | 7/2015 | Kang | G11C 16/10 365/185.18 |
| 2016/0173065 A1 * | 6/2016 | Kim | H03K 3/012 327/109 |
| 2017/0032740 A1 * | 2/2017 | Ko | H03F 3/45273 |

FOREIGN PATENT DOCUMENTS

KR 101163219 7/2012

* cited by examiner

*Primary Examiner* — Toan K Le
(74) *Attorney, Agent, or Firm* — IP & T Group LLP

(57) ABSTRACT

A buffer circuit may include: a current mirror circuit suitable for selectively forming a first current mirror corresponding to a first power source voltage, and a second current mirror corresponding to a second power source voltage; and a differential pair coupled to the current mirror circuit, and suitable for forming a current path with the first current mirror or the second current mirror, amplifying a differential signal corresponding to a difference between a reference voltage and input data received through an input terminal, and outputting the amplified differential signal to an output terminal as a buffer output signal.

16 Claims, 8 Drawing Sheets

BUFFER CIRCUIT AND DEVICE INCLUDING THE SAME

CROSS-REFERENCE TO RELATED APPLICATION

This application claims priority to U.S. Provisional Patent Application No. 62/526,691 entitled, "REFERENCE NODE SELECTED RX BUFFER", filed on Jun. 29, 2017, which is incorporated herein by reference in its entirety.

TECHNICAL FIELD

Exemplary embodiments of the present disclosure relate to a buffer circuit.

DISCUSSION OF THE RELATED ART

Electronic devices such as computers, cellular phones, and a=storage devices may include integrated circuits (ICs) formed by integrating various elements or circuits. Each integrated circuit may be coupled to one or more external circuits or devices, and include a buffer or the like as a component for interfacing the integrated circuit with such an external circuit or device. Since the external circuit or device may use various power sources, various interface components corresponding to the types of power sources to be used may be present on each integrated circuit.

SUMMARY

Various embodiments are directed to a circuit including a buffer capable of supporting various power sources.

In an embodiment, a buffer circuit may include: a current mirror circuit suitable for selectively forming a first current mirror corresponding to a first power source voltage, and a second current mirror corresponding to a second power source voltage; and a differential pair coupled to the current mirror circuit, and suitable for forming a current path with the first current mirror or the second current mirror, amplifying a differential signal corresponding to a difference between a reference voltage and input data received through an input terminal, and outputting the amplified differential signal to an output terminal as a buffer output signal.

In an embodiment, a memory device may include: a memory cell array; and a circuit suitable for providing data received from a data pad, to the memory cell array. The circuit may include: a current mirror circuit suitable for selectively forming a first current mirror corresponding to a first power source voltage, and a second current mirror corresponding to a second power source voltage; and a differential pair coupled to the current mirror circuit, and suitable for forming a current path with the first current mirror or the second current mirror, amplifying a differential signal corresponding to a difference between a reference voltage and input data received through an input terminal, and outputting the amplified differential signal to an output terminal as a buffer output signal.

DETAILED DESCRIPTION

Figure 1A:
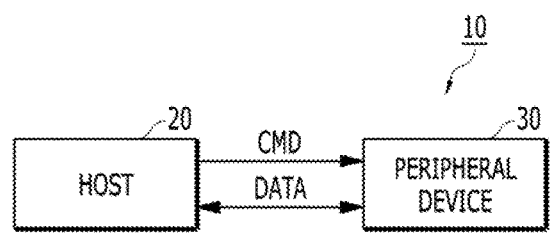
FIGS. 1A and 1B are diagrams illustrating a data processing system.

Exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

It will be further understood that the terms "comprises," "comprising," "includes," and "including" when used in this specification, specify the presence of the stated elements and do not preclude the presence or addition of one or more other elements. As used herein, the term "and/or" Includes any and all combinations of one or more of the associated listed items.

Hereinafter, the various embodiments of the present invention will be described in detail with reference to the attached drawings.

FIGS. 1A and 18B are diagrams illustrating a data processing system 10.

Referring to FIG. 1A, the data processing system 10 may include a host 20 and a peripheral device 30. The peripheral device receives a command CMD (or a request) from the host 20, and exchanges data DATA based on the received command with the host 20. For example, the host 20 may be a computer, a server, a smartphone, or the like, and the peripheral device 30 may be a mobile or storage product.

Figure 1B:
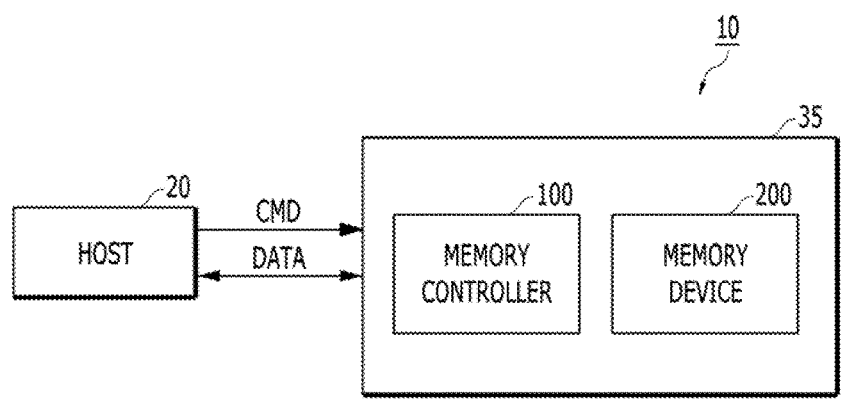

Referring to FIG. 1B, the peripheral device 30 shown in FIG. 1A may be embodied by a memory system 35. That is, the data processing system 10 may include the host 20 and the memory system 35. The host 20 may include, for instance, portable electronic devices such as a cellular phone, an MP3 player, and a laptop computer, and electronic devices such as a desktop computer, a game console, a TV, and a projector.

The memory system 35 may be accessed in response to a command from the host 20. In other words, the memory system 35 may be used as a main memory device or auxiliary memory device of the host 20.

The memory system 35 may include a memory controller 100 and a memory device 200. The memory controller 100 performs an operation of accessing the corresponding memory device 200 in response to a command from the host 20. For example, the memory controller 100 stores write data provided from the host 20 in the memory device 200 in response to a write command from the host 20. As another example, the memory controller 100 reads data stored in the memory device 200 in response to a read command from the host 20, and transmits the read data to the host 20. In various embodiments, the memory device 200 may be a volatile memory device such as a dynamic random access memory (DRAM), or a static RAM (SRAM). In other embodiments, the memory device 200 may be a non-volatile memory device such as a read only memory (ROM), a mask ROM (MROM), a programmable ROM (PROM), an erasable ROM (EPROM), an electrically erasable ROM (EEPROM), a ferroelectric RAM (FRAM), a phase change RAM (PRAM), a magnetic RAM (MRAM), a resistive RAM (RRAM), or a flash memory.

Figure 2:
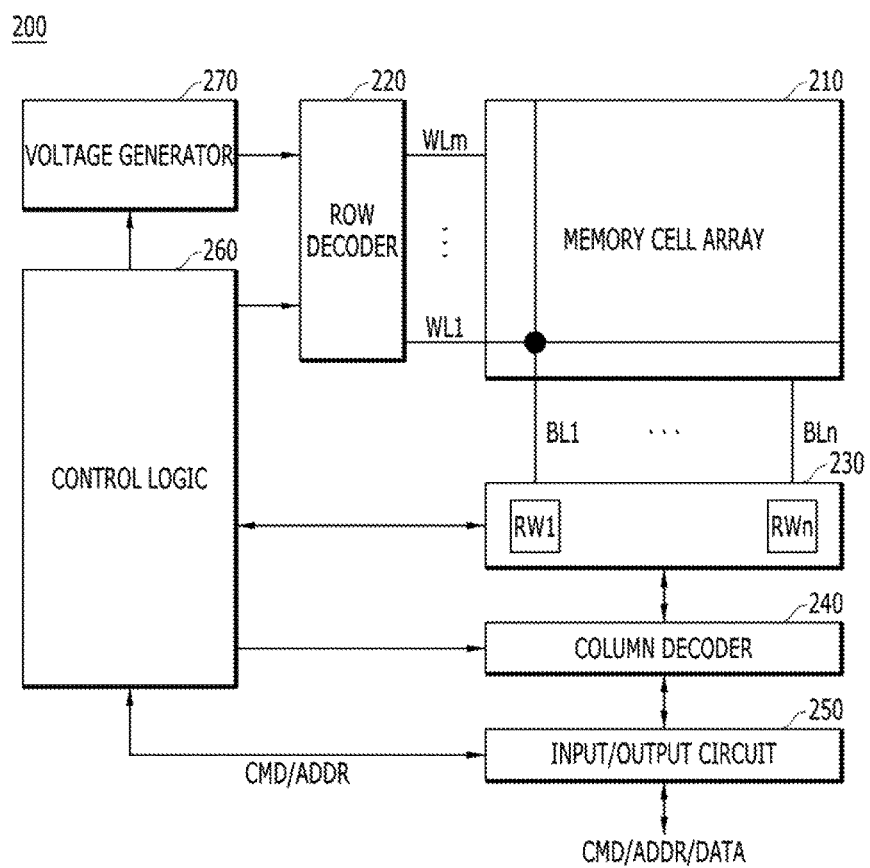
FIG. 2 is a diagram illustrating a memory device in accordance with an embodiment of the present disclosure.

FIG. 2 is a diagram illustrating a memory device in accordance with an embodiment of the present disclosure. For example, FIG. 2 is a diagram illustrating a configuration of a non-volatile memory device, which may be used as the memory device 200 shown in FIG. 1B.

Referring to FIG. 2, the memory device 200 may include a memory cell array 210, a row decoder 220, a data read/write block 230, a column decoder 240, an input/output circuit 250, a control logic 260, and a voltage generator 270.

The memory cell array 210 may include memory cells MC disposed at intersections between word lines WL1 to WLm and bit lines BL1 to BLn.

The row decoder 220 may be coupled to the memory cell array through the word lines WL1 to WLm. The row decoder 220 may operate under control of the control logic 260. The row decoder 220 may decode an address provided from an external device (e.g., the memory controller 100 of FIG. 1B). The row decoder 220 may select and drive the word lines WL1 to WLm based on the result of decoding. For example, the row decoder 220 may provide, to the word lines WL1 to WLm, a word line voltage provided from the voltage generator 270.

The data read/write block 230 may be coupled to the memory cell array 210 through the bit lines BL1 to BLn. The data read/write block 230 may include read/write circuits RW1 to RWn corresponding to the respective bit lines BL1 to BLn. The data read/write block 230 may operate under control of the control logic 260. The data read/write block 230 may operate as a write driver or a sense amplifier depending on an operating mode. For example, during a write operation, the data read/write block 230 may operate as the write driver for storing, in the memory cell array 210, data provided from the external device. As another example, during a read operation, the data read/write block 230 may operate as a sense amplifier for reading data from the memory cell array 210.

The column decoder 240 may operate under control of the control logic 260. The column decoder 240 may decode an address provided from the external device. The column decoder 240 may couple, based on the result of decoding, read/write circuits RW1 to RWn of the data read/write block 230 corresponding to the respective bit lines BL1 to BLn with a data input/output line of the input/output circuit 250.

The voltage generator 270 may generate a voltage to be used for an internal operation of the memory device 200. Voltages generated by the voltage generator 270 may be applied to the memory cells of the memory cell array 210. For example, a program voltage generated during a program operation may be applied to a word line of memory cells on which the program operation is to be performed. As another example, an erase voltage generated during an erase operation may be applied to a well-region of memory cells on which the erase operation is to be performed. As another example, a read voltage generated during a read operation may be applied to a word line of memory cells on which the read operation is to be performed.

The control logic 260 may control overall operations of the memory device 200 based on a signal provided from the external device through the input/output circuit 250. For example, the control logic 260 may control erase, write, and erase operations of the memory device 200.

The input/output circuit 250 may transmit, to the control logic 260, a command CMD and an address ADDR received from the external device, or exchange data DATA with the column decoder 240. Furthermore, the input/output circuit 250 may be coupled to the column decoder 240, and output read data sensed by the data read/write block 230 to the external device through input/output lines (not shown). In addition, the input/output circuit 250 may transmit data received through the input/output lines, to the data read/write block 230 through the column decoder 240.

Figure 3:
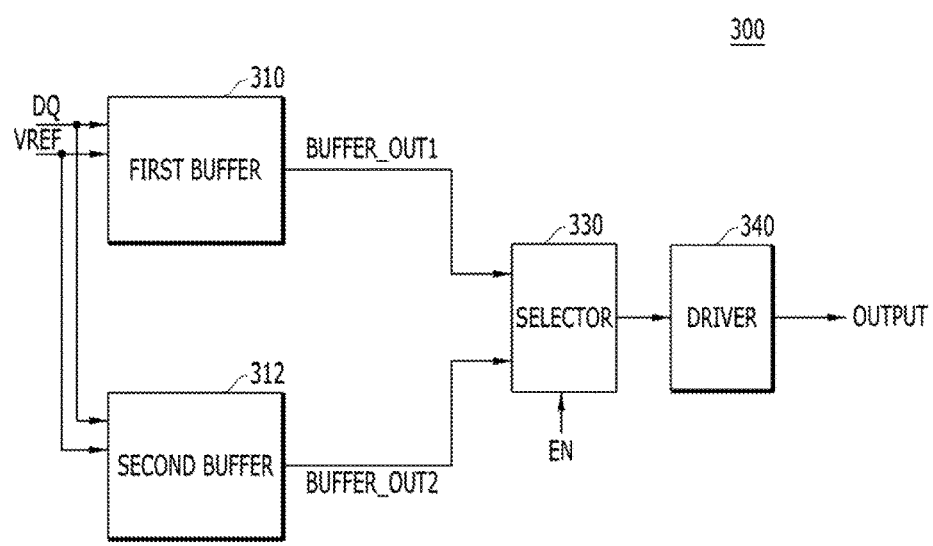
FIG. 3 is a diagram illustrating a conventional circuit including a plurality of buffers for supporting various power source voltages.

FIG. 3 is a diagram illustrating a conventional circuit 300 including a plurality of buffers that support various power source voltages.

Referring to FIG. 3, the circuit 300 may include buffers and a driver as elements for interfacing with the external device. In the case where the circuit 300 is designed to support various power source voltages that may be used in one or more external devices, the circuit 300 may include interface elements corresponding to the types or number of power source voltages. For example, the circuit 300 may include interface elements capable of supporting two types of power source voltages. In other words, the circuit 300 may include a first buffer 310 as an interface element that operates at a first power source voltage, and a second buffer 320 as an interface element that operates at a second power source voltage. Although not shown, the circuit 300 may include slicers that are coupled to the respective read ends of the buffers, slice buffered data, and output sliced signals. For example, the slicers may slice buffered data to a level (e.g., a CMOS level) at which the data can be processed in a device (e.g., the memory device 200 of FIG. 1B) including the circuit 300.

The first buffer 310 may buffer input data received through an input terminal, and output buffered data. For instance, the first buffer 310 may receive data through a data pad DQ, amplify a differential signal corresponding to a difference between the received input data and a reference voltage VREF, and output the amplified differential signal as a buffer output BUFFER_OUT1.

The second buffer 320 may buffer input data received through an input terminal, and output buffered data. For instance, the second buffer 320 may receive data through a data pad DQ, amplify a differential signal corresponding to a difference between the received input data and a reference voltage VREF, and output the amplified differential signal as a buffer output BUFFER_OUT2.

A selector 330 may select the output of any one of the first buffer 310 and the second buffer 320 in response to an enable signal EN. For example, the selector 330 may select the signal BUFFER_OUT1 outputted from the first buffer 310 in response to an enable signal EN corresponding to the first power source voltage, or select the signal BUFFER_OUT2 outputted from the second buffer 320 in response to an enable signal EN corresponding to the second power source voltage.

The driver 340 may receive the output signal BUFFER_OUT1 or BUFFER_OUT2 of the first buffer 310 or the second buffer 320 that has been selected by the selector 330, and drive an output terminal by outputting the received signal BUFFER_OUT1 or BUFFER_OUT2 as an output signal OUTPUT to the output terminal.

Figure 4:
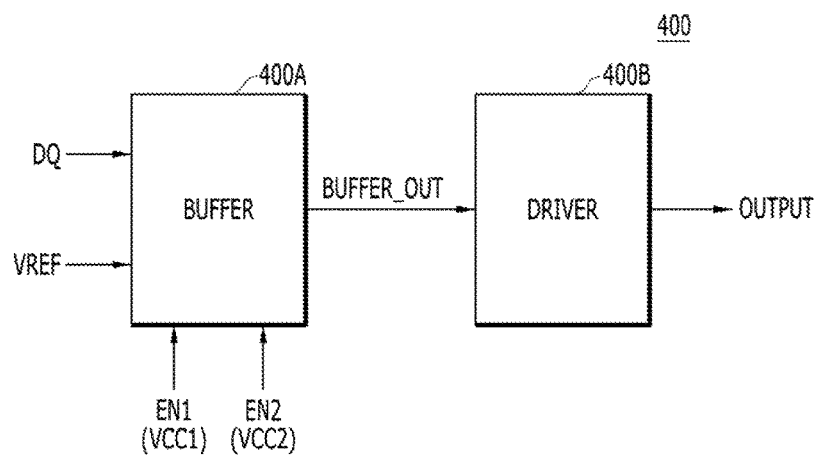
FIG. 4 is a diagram illustrating a circuit including a single buffer capable of supporting various power source voltages in accordance with an embodiment of the present disclosure.

FIG. 4 is a diagram illustrating a circuit 400 including a single buffer capable of supporting various power source voltages in accordance with an embodiment of the present disclosure. For example, the circuit 400 may be a component included in the input/output circuit 250 of the memory device 200 shown in FIG. 2.

Referring to FIG. 4, the circuit 400 may include a buffer 400A coupled between an input terminal DQ and an output terminal (not shown). The buffer 400A may amplify a differential signal corresponding to a difference between a reference voltage VREF and input data received through the input terminal DQ, and output the amplified differential signal to the output terminal as a buffer output signal BUFFER_OUT. The buffer 400A may operate at a first power source voltage VCC1 (e.g., 1.2 V) or a second power source voltage VCC2 (e.g., 1.8 V).

The buffer 400A may amplify the differential signal in response to a first enable signal EN1 for the first power source voltage VCC1, and output the amplified differential signal as a buffer output signal BUFFER_OUT. The buffer 400A may amplify the differential signal in response to a second enable signal EN2 for the second power source voltage VCC2, and output the amplified differential signal as a buffer output signal BUFFER_OUT. As such, the buffer 400A may be a single buffer capable of supporting two types of power source voltages, unlike the circuit 300, which includes the first buffer 310 and the second buffer 312. In other words, the buffer 400A may be a combination buffer capable of supporting two types of power source voltages.

The circuit 400 may further include a driver 400B coupled between the buffer 400A and the output terminal. The driver 400B may drive the output terminal using the buffer output signal BUFFER_OUT provided from the buffer 400A. The circuit 400 may not include a selector or a selection unit, unlike the circuit 300, which includes the selector 330.

Figure 5:
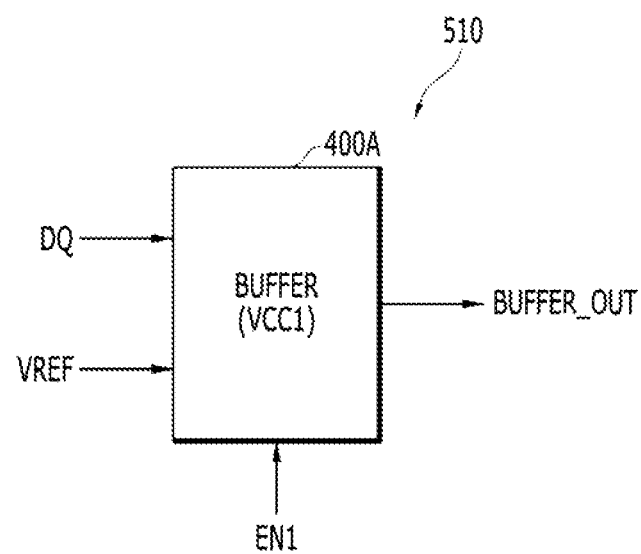
FIG. 5 is a diagram illustrating the single buffer functioning as a buffer for supporting two power source voltages, in accordance with an embodiment of the present disclosure.
Figure 5:
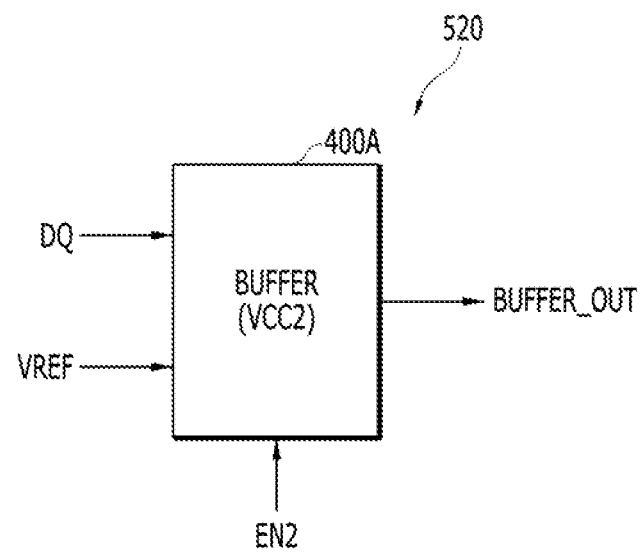

FIG. 5 is a diagram illustrating the single buffer functioning as a buffer for supporting two power source voltages, in accordance with an embodiment of the present disclosure. For example, FIG. 5 illustrates an example in which the buffer 400A shown in FIG. 4 operates at the first source voltage VCC1 (e.g., 1.2 V) or the second power source voltage VCC2 (e.g., 1.8 V).

Referring to FIG. 5, the buffer 400A may amplify, in response to the first enable signal EN1 for the first power source voltage VCC1, a differential signal corresponding to a difference between the reference voltage VREF and input data received through the input terminal DQ, and output the amplified differential signal as the buffer output signal BUFFER_OUT (in the case of 510).

The buffer 400A may amplify, in response to the second enable signal EN2 for the second power source voltage VCC2, a differential signal corresponding to a difference between the reference voltage VREF and input data received through the input terminal DQ, and output the amplified differential signal as the buffer output signal BUFFER_OUT (in the case of 520).

As such, the buffer 400A may operate at the first power source voltage VCC1 or the second power source voltage VCC2.

Figure 6:
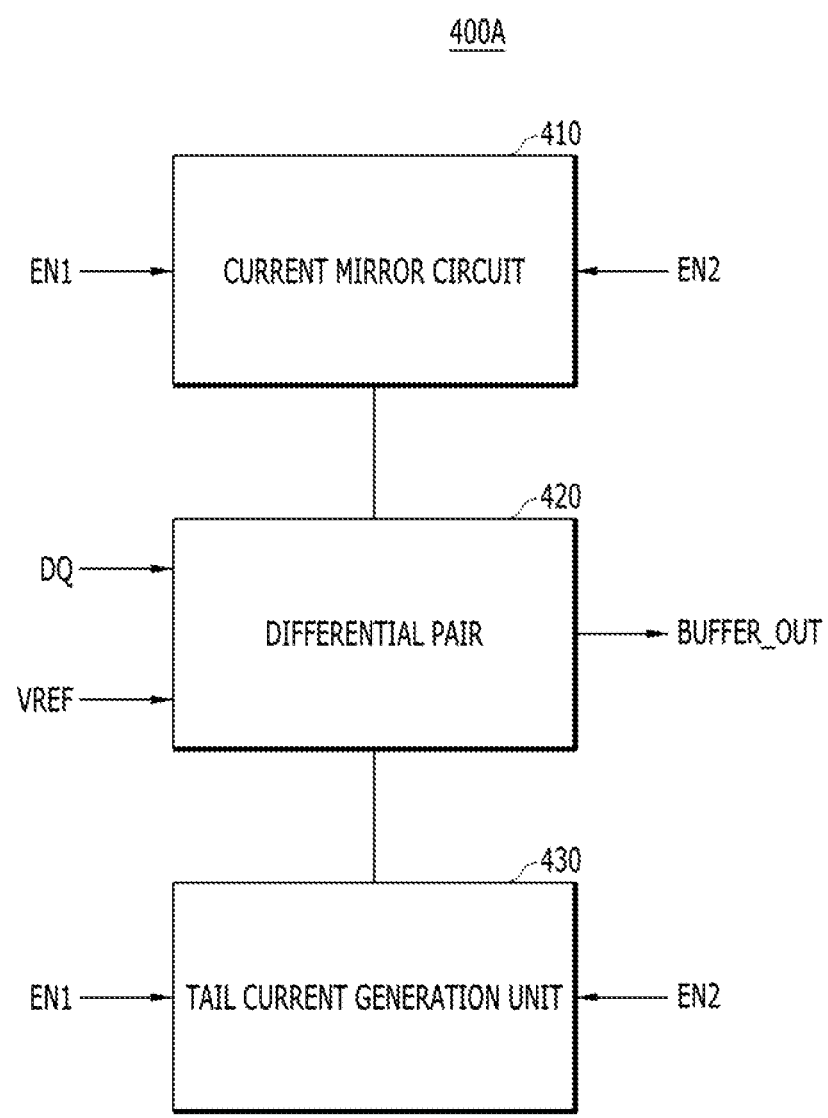
FIG. 6 is a block diagram illustrating a configuration of the buffer in accordance with an embodiment of the present disclosure.
Figure 7:
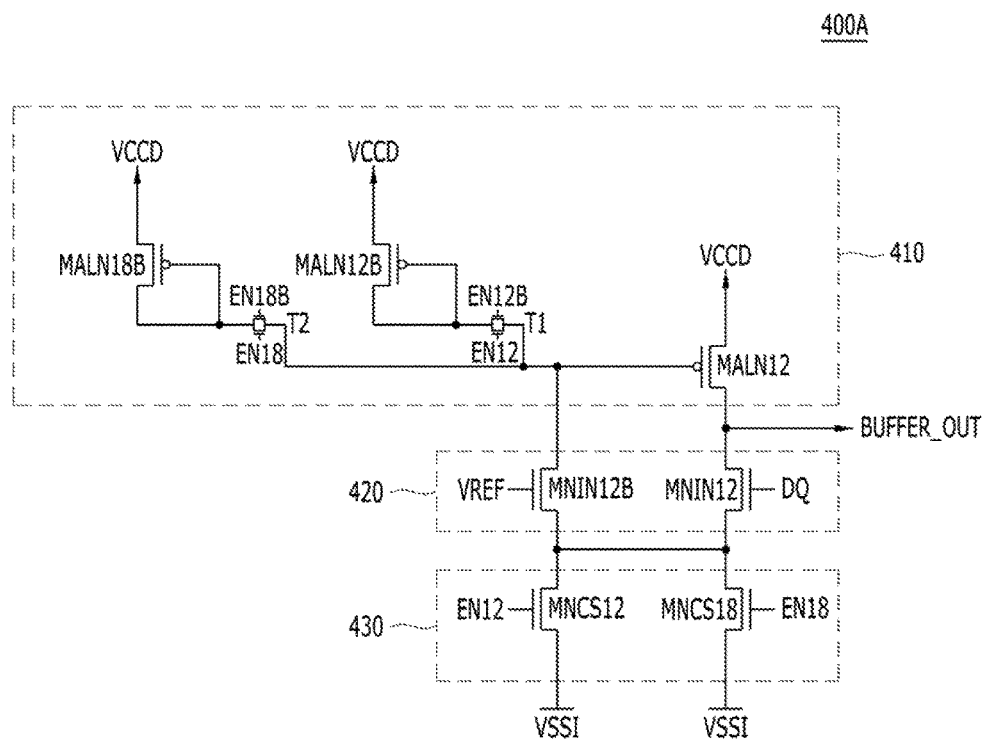
FIG. 7 is a circuit diagram illustrating a configuration of the buffer in accordance with an embodiment of the present disclosure.

FIG. 6 is a block diagram illustrating the configuration of the buffer 400A in accordance with an embodiment of the present disclosure. FIG. 7 is a circuit diagram illustrating a configuration of the buffer 400A in accordance with an embodiment of the present disclosure.

Referring to FIG. 6, the buffer 400A may include a current mirror circuit 410 and a differential pair 420.

The current mirror circuit 410 may operate as a first current mirror to be formed in response to the first enable signal EN1 for the first power source voltage VCC1 (e.g., 1.2 V), or as a second current mirror to be formed in response to the second enable signal EN2 for the second power source voltage VCC2 (e.g., 1.8 V).

The differential pair 420 may be coupled to the current mirror circuit 410 and form a current path with the first current mirror or the second current mirror. The differential pair 420 may amplify a differential signal corresponding to a difference between the reference voltage VREF and the input data received through the input terminal DQ, and output the amplified differential signal as the buffer output signal BUFFER_OUT.

The buffer 400A may further include a tail current generation unit 430. The tail current generation unit 430 may generate tail current from the current path formed by the current mirror circuit 410 and the differential pair 420. In other words, the tail current generation unit 430 may sink current from the current path formed by the current mirror circuit 410 and the differential pair 420.

Referring to FIG. 7, the differential pair 420 may include a first differential transistor MNIN12B and a second differential transistor MNIN12. The first differential transistor MNIN12B may include a first terminal coupled to the current mirror circuit 410, a second terminal coupled to receive the reference voltage VREF, and a third terminal coupled to a ground terminal VSSI through the tail current generation unit 430. The second differential transistor MNIN12 may include a first terminal coupled to the current mirror circuit 410 and the output terminal, a second terminal coupled to the input terminal DQ, and a third terminal coupled to the ground terminal VSSI through the tail current generation unit 430. In various embodiments, each of the first differential transistor MNIN12B and the second differential transistor MNIN12 may be an N-channel metal oxide semiconductor (MOS) or an NMOS field effect transistor (FET) that operates at the first power source voltage VCC1.

The current mirror circuit 410 may include a first mirror transistor MALN12B, a second mirror transistor MALN18B, and a third mirror transistor MALN12. The first mirror transistor MALN12B may include a first terminal coupled to a power source voltage terminal VCCD for the first power source voltage VCC1, and a second terminal and a third terminal that are selectively coupled to the first terminal of the first differential transistor MNIN12B. The second mirror transistor MALN18B may include a first terminal coupled to a power source voltage terminal VCCD for the second power source voltage VCC2, and a second terminal and a third terminal that are selectively coupled to the first terminal of the first differential transistor MNIN12B. The third mirror transistor MALN12 may include a first terminal coupled to the power source voltage terminal VCCD for the first power source voltage VCC1, and a second terminal coupled to the first terminal of the first differential transistor MNIN12B, and a third terminal coupled to the first terminal of the second differential transistor MNIN18B and the output terminal.

In various embodiments, the first mirror transistor MALN12B may be a P-channel MOS or a PMOS FET that operates at the first power source voltage VCC1. The second mirror transistor MALN18B may be a P-channel MOS or a PMOS FET that operates at the second power source voltage VCC2. The third mirror transistor MALN12 may be an N-channel MOS or an NMOS FET that operates at the first power source voltage VCC1.

The current mirror circuit 410 may further include a first pass gate or transfer transistor T1 and a second pass gate T2. The first pass gate T1 may be switched in response to the first enable signal EN1 for the first power source voltage VCC1 and thus couple the second terminal and the third terminal of the first mirror transistor MALN12B with the first terminal of the first differential transistor MNIN12B. The second pass gate T2 may be switched in response to the second enable signal EN2 for the second power source voltage VCC2 and thus couple the second terminal and the third terminal of the second mirror transistor MALN18B with the first terminal of the first differential transistor MNIN12B.

As such, when the first pass gate T1 is switched on, the first mirror transistor MALN12B and the third mirror transistor MALN12 may form a first current mirror circuit. On the other hand, when the second pass gate T2 is switched on, the second mirror transistor MALN18B and the third mirror transistor MALN12 may form a second current mirror circuit. In other words, the first pass gate T1 operates such that the first mirror transistor MALN12B that operates at the first reference voltage VCC1 is coupled to a node that receives the reference voltage, i.e., to the first differential transistor MNIN12B of the differential pair 420. On the other hand, the second pass gate T2 operates such that the second mirror transistor MALN18B that operates at the second reference voltage VCC2 is coupled to the node that receives the reference voltage, i.e., to the first differential transistor MNIN12B of the differential pair 420.

The tail current generation unit 430 may include a first tail transistor MNCS12 and a second tail transistor MNCS18.

The first tail transistor MNCS12 may include a first terminal coupled to the differential pair 420, a second terminal coupled to receive the first enable signal EN1 for the first power source voltage VCC1, and a third terminal coupled to the ground terminal VSSI. The second tail transistor MNCS18 may include a first terminal coupled to the differential pair 420, a second terminal coupled to receive the second enable signal EN2 for the second power source voltage VCC2, and a third terminal coupled to the ground terminal VSSI. The first tail transistor MNCS12 may be turned on in response to the first enable signal EN1, and the second tail transistor MNCS18 may be turned on in response to the second enable signal EN2.

In various embodiments, the first tail transistor MNCS12 may be an N-channel MOS or an NMOS FET that operates at the first power source voltage VCC1, and the second tail transistor MNCS18 may be an N-channel MOS or an NMOS FET that operates at the second power source voltage VCC2.

Figure 8A:
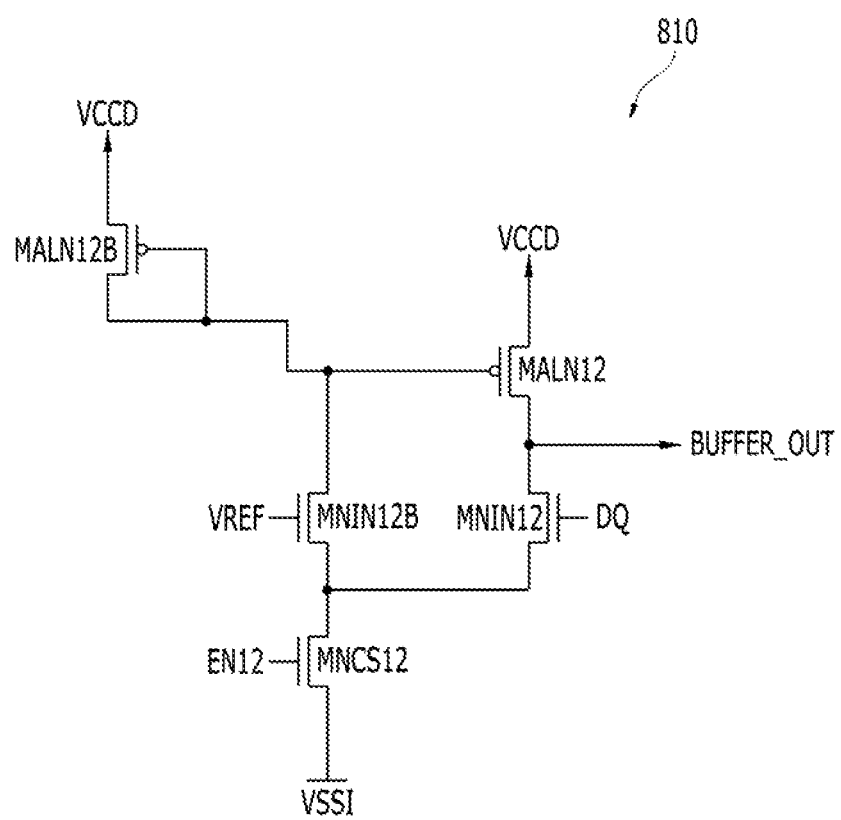
FIGS. 8A and 8B are diagrams respectively illustrating operations of the buffer at a first power source voltage and a second power source voltage in accordance with an embodiment of the present disclosure.
Figure 8B:
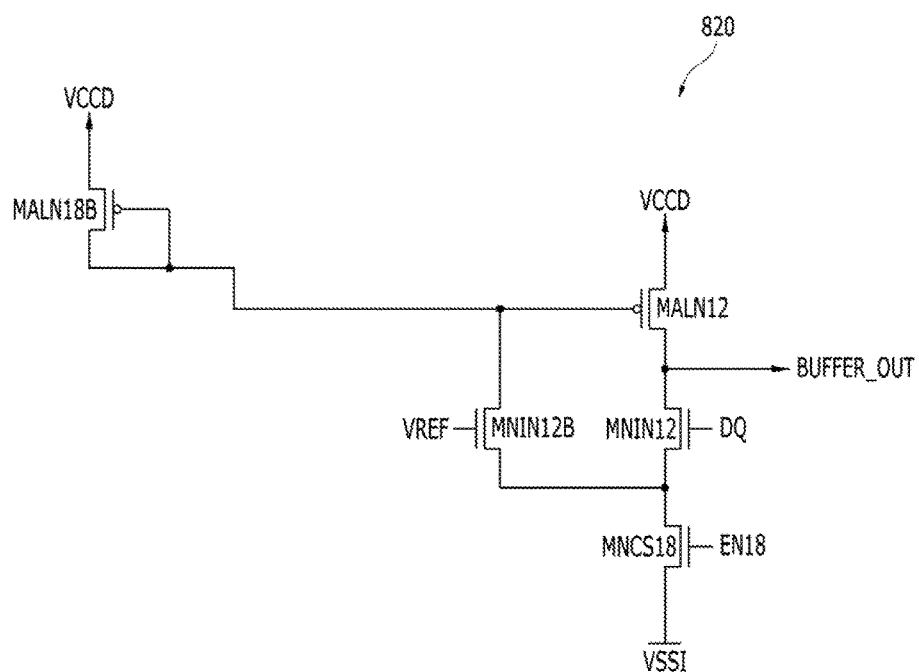

FIGS. 8A and 8B are diagrams illustrating examples in which the buffer in accordance with an embodiment of the present disclosure, e.g., the buffer 400A shown in FIG. 7, operates at the first power source voltage VCC1 and the second power source voltage VCC2, respectively.

Referring to FIG. 8A, in response to the first enable signal EN1 for the first power source voltage VCC1, the first mirror transistor MALN12B and the first tail transistor MNCS12 may be turned on, and the first pass gate T1 may be switched on, so that the first power source voltage VCC1 may be provided to the first differential transistor MNIN12B that is the node for receiving the reference voltage of the differential pair 420. Thereby, the first current mirror including the first mirror transistor MALN12B and the third mirror transistor MALN12 may form the current mirror circuit 410, and the first tail current generation unit including the first tail transistor MNCS12 may form the tail current generation unit 430. The formed current mirror circuit 410 and tail current generation unit 430 may be coupled to the transistors MNIN12B and MNIN12 of the differential pair 420, thus forming the buffer 400A as a first buffer. The differential pair 420 of the buffer 400A may amplify a differential signal corresponding to a difference between the reference voltage VREF and input data received through the input terminal DQ, and output the amplified differential signal as the buffer output signal BUFFER_OUT.

Referring to FIG. 88B, in response to the second enable signal EN2 for the second power source voltage VCC2, the second mirror transistor MALN18B and the second tail transistor MNCS18 may be turned on, and the second pass gate T2 may be switched on, so that the second power source voltage VCC2 may be provided to the first differential transistor MNIN12B that is the node for receiving the reference voltage of the differential pair 420. Thereby, the second current mirror including the second mirror transistor MALN18B and the third mirror transistor MALN12 may form the current mirror circuit 410, and the second tail current generation unit including the second tail transistor MNCS18 may form the tail current generation unit 430. The formed current mirror circuit 410 and tail current generation unit 430 may be coupled to the transistors MNIN12B and MNIN12 of the differential pair 420, thus forming the buffer 400A as a second buffer. The differential pair 420 of the buffer 400A may amplify a differential signal corresponding to a difference between the reference voltage VREF and input data received through the input terminal DQ, and output the amplified differential signal as the buffer output signal BUFFER_OUT.

In various embodiments, the first enable signal for the first power source voltage VCC1 and the second enable signal EN2 for the second power source voltage VCC2 may be alternately provided to the buffer 400A. For example, when the first enable signal EN1 has a logic level of "high (H)", the second enable signal EN2 may have a logic level of "low (L)", whereby the buffer 400A may operate as the first buffer. For example, when the second enable signal EN2 has a logic level of "high (H)", the first enable signal EN1 may have a logic level of "low (L)", whereby the buffer 400A may operate as the second buffer. As such, the single buffer 400A may be the first buffer that operates at the first power source voltage VCC1 in response to the first enable signal EN1, or the second buffer that operates at the second power source voltage VCC2 in response to the second enable signal EN2. In other words, the single buffer 400A may support two kinds of power source voltages VCC1 and VCC2.

As described above, in accordance with embodiments of the present disclosure, a combination circuit including a single buffer capable of supporting a plurality of power source voltages may be embodied, so that a corresponding power source voltage may be selectively provided to a reference voltage receiving node of a differential pair. In this way, the single buffer may support a plurality of power source voltages in such a way that the corresponding power source voltage is applied to the reference voltage receiving node of the differential pair. Consequently, the number of components which have been required for the respective buffers may be reduced. Furthermore, a component for selecting only one of the outputs of the buffers may be omitted.

Although various embodiments have been described for illustrative purposes, it will be apparent to those skilled in the art that various changes and modifications may be made without departing from the spirit and scope of the disclosure as defined in the following claims.

What is claimed is:

1. A buffer circuit comprising:
a current mirror circuit suitable for selectively forming a first current mirror corresponding to a first power source voltage, and a second current mirror corresponding to a second power source voltage, wherein the second power source voltage has a different level from the first power source voltage; and
a differential pair coupled to the current mirror circuit, and suitable for forming a current path with the first current mirror or the second current mirror, amplifying a differential signal corresponding to a difference between a reference voltage and input data received through an input terminal, and outputting the amplified differential signal to an output terminal as a buffer output signal.

2. The buffer circuit of claim 1, further comprising a driver suitable for driving the output terminal using the buffer output signal.

3. The buffer circuit of claim 1, wherein the differential pair comprises:
a first differential transistor comprising a first terminal coupled to the current mirror circuit, a second terminal coupled to receive the reference voltage, and a third terminal coupled to a ground terminal; and
a second differential transistor comprising a first terminal coupled to the current mirror circuit and the output terminal, a second terminal coupled to the input terminal, and a third terminal coupled to the ground terminal.

4. The buffer circuit of claim 3, wherein the first and second differential transistors operate at the first power source voltage.

5. The buffer circuit of claim 3, wherein the current mirror circuit comprises:
a first mirror transistor comprising a first terminal coupled to a power source voltage terminal for the first power source voltage, and a second terminal and a third terminal configured to be selectively coupled to the first terminal of the first differential transistor;
a second mirror transistor comprising a first terminal coupled to a power source voltage terminal for the second power source voltage, and a second terminal and a third terminal configured to be selectively coupled to the first terminal of the first differential transistor; and
a third mirror transistor comprising a first terminal coupled to the power source voltage terminal for the first power source voltage, a second terminal coupled to the first terminal of the first differential transistor, and a third terminal coupled to the first terminal of the second differential transistor and the output terminal.

6. The buffer circuit of claim 5, wherein the current mirror circuit comprises:
a first pass gate suitable for coupling, in response to a first enable signal for the first power source voltage, the second terminal and the third terminal of the first mirror transistor with the first terminal of the first differential transistor; and
a second pass gate suitable for coupling, in response to a second enable signal for the second power source voltage, the second terminal and the third terminal of the second mirror transistor with the first terminal of the first differential transistor.

7. The buffer circuit of claim 3, further comprising a tail current generation unit suitable for generating tail current from the current path formed by the current mirror circuit and the differential pair.

8. The buffer circuit of claim 7, wherein the tail current generation unit comprises:
a first tail transistor comprising a first terminal coupled to the differential pair, a second terminal coupled to receive a first enable signal for the first power source voltage, and a third terminal coupled to the ground terminal; and
a second tail transistor comprising a first terminal coupled to the differential pair, a second terminal coupled to receive a second enable signal for the second power source voltage, and a third terminal coupled to the ground terminal.

9. A memory device comprising:
a memory cell array; and
a circuit suitable for providing data received from a data pad, to the memory cell array,
wherein the circuit comprises:
a current mirror circuit suitable for selectively forming a first current mirror corresponding to a first power source voltage, and a second current mirror corresponding to a second power source voltage, wherein the second power source voltage has a different level from the first power source voltage; and
a differential pair coupled to the current mirror circuit, and suitable for forming a current path with the first current mirror or the second current mirror, amplifying a differential signal corresponding to a difference between a reference voltage and input data received through an input terminal, and outputting the amplified differential signal to an output terminal as a buffer output signal.

10. The memory device of claim 9, further comprising a driver suitable for driving the output terminal using the buffer output signal.

11. The memory device of claim 9, wherein the differential pair comprises:
a first differential transistor comprising a first terminal coupled to the current mirror circuit, a second terminal coupled to receive the reference voltage, and a third terminal coupled to a ground terminal; and
a second differential transistor comprising a first terminal coupled to the current mirror circuit and the output terminal, a second terminal coupled to the input terminal, and a third terminal coupled to the ground terminal.

12. The memory device of claim 11, wherein each of the first and second differential transistors operates at the first power source voltage.

13. The memory device of claim 11, wherein the current mirror circuit comprises:

a first mirror transistor comprising a first terminal coupled to a power source voltage terminal for the first power source voltage, and a second terminal and a third terminal configured to be selectively coupled to the first terminal of the first differential transistor;

a second mirror transistor comprising a first terminal coupled to a power source voltage terminal for the second power source voltage, and a second terminal and a third terminal configured to be selectively coupled to the first terminal of the first differential transistor; and a third mirror transistor comprising a first terminal coupled to the power source voltage terminal for the first power source voltage, a second terminal coupled to the first terminal of the first differential transistor, and a third terminal coupled to the first terminal of the second differential transistor and the output terminal.

14. The memory device of claim 13, wherein the current mirror circuit comprises:

a first pass gate suitable for coupling, in response to a first enable signal for the first power source voltage, the second terminal and the third terminal of the first mirror transistor with the first terminal of the first differential transistor; and a second pass gate suitable for coupling, in response to a second enable signal for the second power source voltage, the second terminal and the third terminal of the second mirror transistor with the first terminal of the first differential transistor.

15. The memory device of claim 11, further comprising a tail current generation unit suitable for generating tail current from the current path formed by the current mirror circuit and the differential pair.

16. The memory device of claim 15, wherein the tail current generation unit comprises:

a first tail transistor comprising a first terminal coupled to the differential pair, a second terminal coupled to receive a first enable signal for the first power source voltage, and a third terminal coupled to the ground terminal; and a second tail transistor comprising a first terminal coupled to the differential pair, a second terminal coupled to receive a second enable signal for the second power source voltage, and a third terminal coupled to the ground terminal.

* * * * *